(12) United States Patent
Ji

(10) Patent No.: US 12,315,557 B2
(45) Date of Patent: May 27, 2025

(54) MEMORY AND METHOD OF OPERATION WITH DUMMY AND LOADED ROUTE

(71) Applicant: CHANGXIN MEMORY TECHNOLOGIES, INC., Hefei (CN)

(72) Inventor: Kangling Ji, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 193 days.

(21) Appl. No.: 18/169,167

(22) Filed: Feb. 14, 2023

(65) Prior Publication Data

US 2024/0096407 A1 Mar. 21, 2024

(30) Foreign Application Priority Data

Sep. 15, 2022 (CN) .......................... 202211123750.9

(51) Int. Cl.
*G11C 11/4096* (2006.01)
*G11C 11/408* (2006.01)
*G11C 11/4093* (2006.01)

(52) U.S. Cl.
CPC ...... *G11C 11/4096* (2013.01); *G11C 11/4087* (2013.01); *G11C 11/4093* (2013.01)

(58) Field of Classification Search
CPC ............ G11C 11/4096; G11C 11/4087; G11C 11/4093; G11C 11/4097; G11C 5/063; G11C 7/1093; G11C 7/227; G11C 7/1096; G11C 8/10

See application file for complete search history.

(56) References Cited

U.S. PATENT DOCUMENTS

2008/0037318 A1* 2/2008 Hidaka .................. G11C 11/16
365/171
2020/0402587 A1* 12/2020 Chibvongodze .... G11C 11/5635

FOREIGN PATENT DOCUMENTS

| CN | 110415743 A | 11/2019 |
| CN | 110580933 A | 12/2019 |
| CN | 112102865 A | 12/2020 |
| TW | 679518 B | 3/2004 |
| TW | I480870 B | 4/2015 |

OTHER PUBLICATIONS

CN first office action in application No. 202211124337.4, mailed on Oct. 17, 2024.

* cited by examiner

*Primary Examiner* — Sultana Begum
(74) *Attorney, Agent, or Firm* — Syncoda LLC; Feng Ma

(57) ABSTRACT

A memory includes: a storage cell array; a write driver; and a first column decoder, the first column selection line includes a dummy route and a loaded route, the dummy route is coupled to the first column decoder and the loaded route and transmits a first column selection signal to the loaded route; the loaded route is coupled to a first storage cell area and transmits the first column selection signal to the first storage cell area; the first column selection signal selects a storage cell column, on which a write operation is performed, from the first storage cell area. A transmission direction of a data signal to be written transmitted by the write driver is identical to a transmission direction of the first column selection signal transmitted via the loaded route.

9 Claims, 4 Drawing Sheets

MEMORY AND METHOD OF OPERATION WITH DUMMY AND LOADED ROUTE

CROSS-REFERENCE TO RELATED APPLICATION

The present application claims priority to Chinese Patent Application No. 202211123750.9 filed on Sep. 15, 2022, the disclosure of which is hereby incorporated by reference in its entirety.

BACKGROUND

A Dynamic Random Access Memory (DRAM) includes storage cells arranged in an array, each of the storage cells includes a transistor and a capacitor. The DRAM is widely used in electronic devices such as a mobile device and a computer. With development of manufacturing process techniques, the capacity of the DRAM is gradually increased. However, in a process of operating the memory, there are problems of write errors. Therefore, how to improve the writing accuracy of the memory is the problem urgently needed to be solved presently.

SUMMARY

The disclosure relates to the field of semiconductor technologies, in particular to a memory and a method for operating the same.

According to a first aspect of embodiments of the disclosure, a memory is provided, which include: a storage cell array, a write driver and a first column decoder.

The write driver is coupled to the storage cell array and configured to transmit a data signal to be written to the storage cell array according to a received write operation command.

The first column decoder is coupled to a first storage cell area of the storage cell array via a first column selection line and is configured to perform a write operation on the storage cell array.

The first column selection line includes a dummy route and a loaded route.

The dummy route is coupled to the first column decoder and the loaded route and is configured to transmit a first column selection signal to the loaded route.

The loaded route is coupled to the first storage cell area and is configured to transmit the first column selection signal to the first storage cell area. The first column selection signal is configured to select a storage cell column, on which the write operation is performed, from the first storage cell area.

Herein, a transmission direction of the data signal to be written transmitted by the write driver is identical to a transmission direction of the first column selection signal transmitted via the loaded route.

According to a second aspect of embodiments of the disclosure, a method for operating a memory is provided. The memory may include a storage cell array, a write driver, a first column decoder and a first column selection line, the first column selection line includes a dummy route and a loaded route and the first column decoder is coupled to the storage cell array via the dummy route and the loaded route.

The method includes the following operations.

The write driver transmits a data signal to be written to a first storage cell area of the storage cell array according to a received write operation command.

The first column decoder transmits a first column selection signal to the loaded route via the dummy route.

The loaded route transmits the first column selection signal to the first storage cell area, the first column selection signal is configured to select a storage cell column, on which the write operation is performed, from the first storage cell area.

Herein, a transmission direction of the data signal to be written transmitted by the write driver is identical to a transmission direction of the first column selection signal transmitted via the loaded route.

DETAILED DESCRIPTION

The technical solution of the disclosure will be further described below in combination with the drawings and specific embodiments.

In the embodiments of the disclosure, terms such as "first" and "second" are used for distinguishing similar objects rather than describing a specific sequence or order.

In the embodiments of the disclosure, the term "A contacts B" includes a condition that A directly contacts B or a condition that other components are inserted between A and B and A indirectly contacts B.

In the embodiments of the disclosure, the term "layer" refers to a material part of an area having a thickness. The layer may extend the overall structure below or above or may have a range smaller than a range of the structure below or above. In addition, the layer may be an area of a homogenous or nonhomogeneous continuous structure with a thickness smaller than the thickness of a continuous structure. For example, the layer may be located between a top surface and a bottom surface of the continuous structure or the layer may be between any horizontal planes at the top surface and the bottom surface of the continuous structure. The layer may extend horizontally and perpendicularly and/or along an inclined surface. Furthermore, the layer may include a plurality of sub-layers.

It is to be understood that meaning of "on", "above" and "over" in the disclosure shall be read in the broadest manner, so that the "on" not only represents meaning that it is "on" a certain object and has no intermediate feature or layer (i.e., directly on the certain object), but also further includes meaning that it is "on" the certain object and has the intermediate feature or layer.

A memory may include a memory array, a row address decoding driver circuit and a column address decoding driver circuit. As a capacity of the memory increases, an area of the memory array becomes larger and a single column address decoding driver circuit cannot drive a longer and longer column address line. Therefore, the memory array may be driven by dual-side driven column address decoding circuit.

Figure 1:
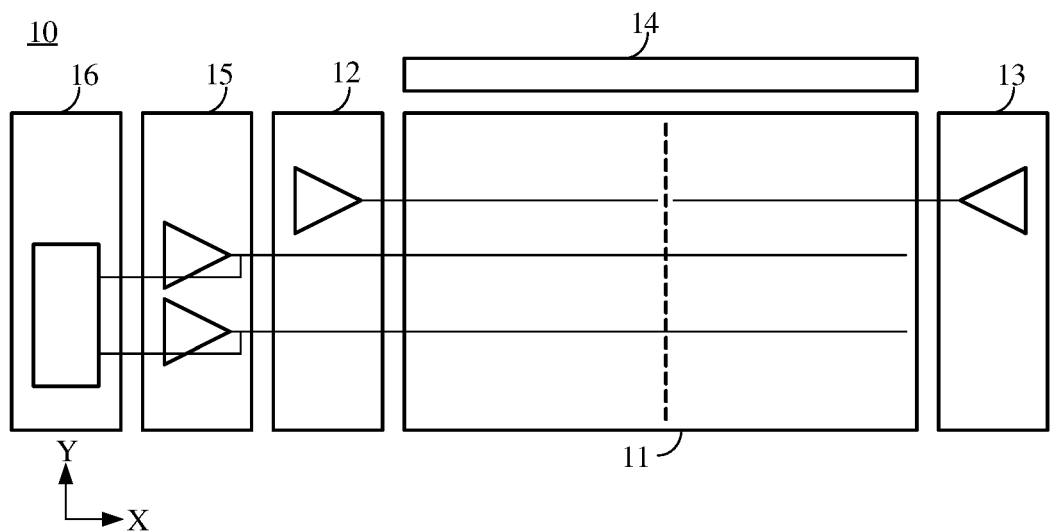
FIG. 1 is a schematic structural diagram of a memory according to an exemplary embodiment.
Figure 2:
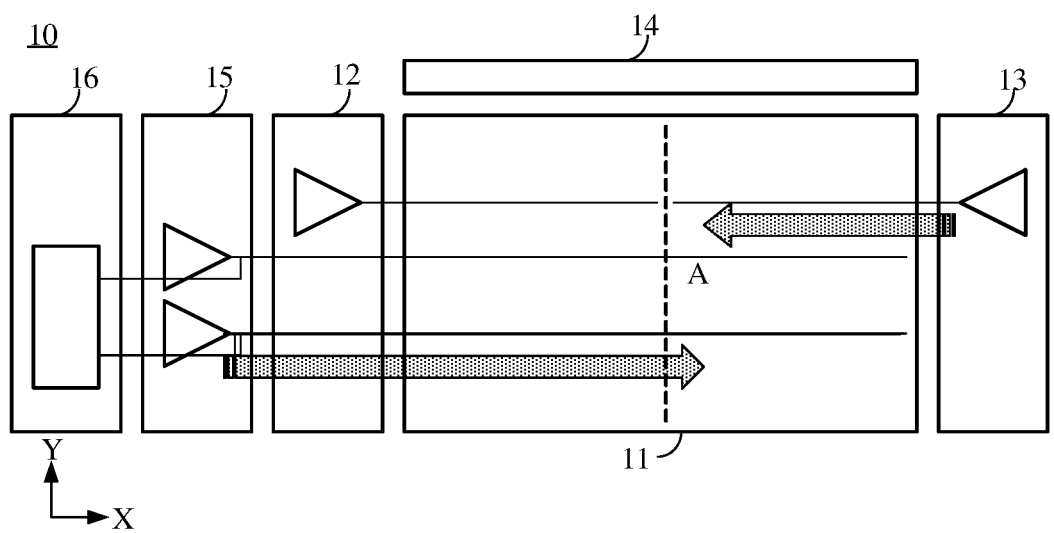
FIG. 2 is a schematic diagram of a write operation for the memory according to FIG. 1.

Exemplarily, FIG. 1 is a schematic structural diagram of a memory according to an exemplary embodiment. As shown in FIG. 1, a memory 10 may include a memory cell array 11, and a first column decoder 12, a second column decoder 13, a row decoder 14, a write driver 15 and a read amplifier 16 coupled to the memory storage array 11. Herein, the read amplifier 16, the write driver 15, the first column decoder 12, the memory cell array 11 and the second column decoder 13 are successively arranged along a positive X axis direction, and the memory cell array 11 and the row decoder 14 are successively arranged along a positive Y axis direction. Exemplarily, the storage cell array 11 is divided into a left side area and a right side area according to a dotted line shown in FIG. 1. Herein, the first column decoder 12 may transmit a column selection signal to the left side area of the storage cell array 11, and the second column decoder 13 may transmit the column selection signal to the right side area of the storage cell array 11. Referring to FIG. 2, FIG. 2 is a schematic diagram of a write operation for the memory according to FIG. 1. The write driver 15 transmits a data signal to be written to a storage cell A in the right side area of the storage cell array 11 along the positive X axis direction according to a received write operation command. The storage cell A shown in FIG. 2 is close to a center dotted line of the storage cell array 11. The second column decoder 13 transmits the column selection signal to the storage cell array 11 along a negative X axis direction to select a storage cell column, on which the write operation is performed, from the storage cell array 11.

As shown in FIG. 2, signal lines with an arrow pointing in FIG. 2 illustrate a process that the write driver 15 transmits the data signal to be written to the storage cell A along the positive X axis direction, and the second column decoder 13 transmits the column selection signal to the storage cell A along the negative X axis direction. In a case where the write operation is performed on the storage cell A in the right side area of the storage cell array 11, as shown in FIG. 2, since the second column decoder 13 and the write driver 15 respectively transmit the column selection signal and the data signal to be written to the storage cell array 11 along two different directions (i.e. opposite directions), the column selection signal and the data signal to be written for the storage cell A are driven and transmitted respectively along opposite directions, which results in poor time sequence performance of performing the write operation on the storage cell in the right side area of the storage cell array 11.

Figure 3:
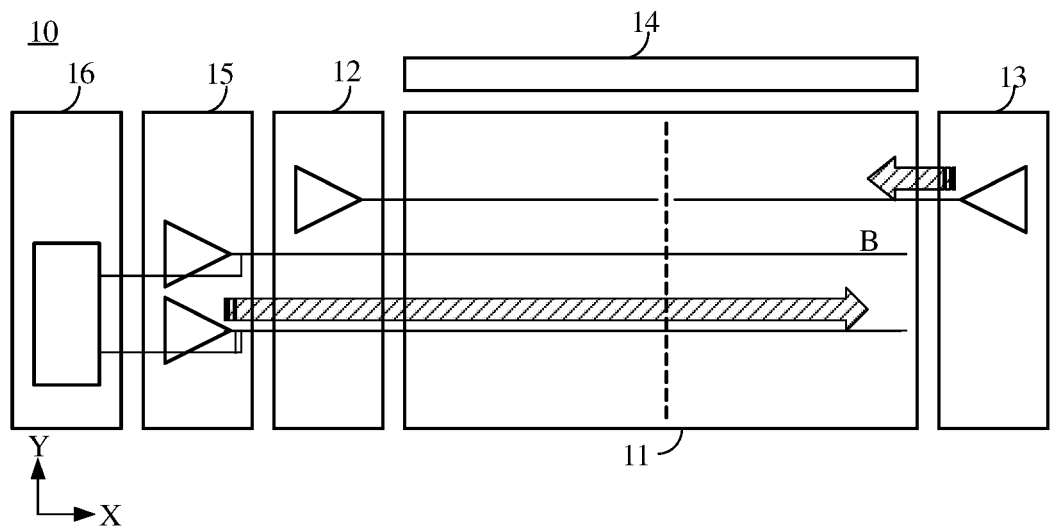
FIG. 3 is a schematic diagram of another write operation for the memory according to FIG. 1.

Referring to FIG. 3, FIG. 3 is a schematic diagram of another write operation for the memory according to FIG. 1. As shown in FIG. 3, the write driver 15 transmits a data signal to be written to a storage cell B in the right side area of the storage cell array 11 along the positive X axis direction according to a received write operation command. The storage cell B shown in FIG. 3 is away from the center dotted line of the storage cell array 11. The second column decoder 13 transmits the column selection signal to the storage cell array 11 along the negative X axis direction to select a storage cell column, on which the write operation is performed, from the storage cell array 11.

As shown in FIG. 3, signal lines with an arrow pointing in FIG. 3 illustrate a process that the write driver 15 transmits the data signal to be written to the storage cell B along the positive X axis direction, and the second column decoder 13 transmits the column selection signal to the storage cell B along the negative X axis direction. In a case where the write operation is performed on the storage cell B in the right side area of the storage cell array 11, as shown in FIG. 3, since the second column decoder 13 and the write driver 15 respectively transmit the column selection signal and the data signal to be written to the storage cell array 11 along two different directions (opposite directions), the column selection signal and the data signal to be written for the storage cell B are driven and transmitted respectively along opposite directions, which results in poor time sequence performance of performing the write operation on the storage cell in the right side area of the storage cell array 11.

Referring to FIG. 2 and FIG. 3, in a case where the write operation is performed on the right side area of the storage cell array 11, for the storage cell A and the storage cell B at different distance from the second column decoder 13 or the write driver 15, the column selection signal and the data signal to be written are driven and transmitted respectively along opposite directions, which results in poor time sequence performance of performing the write operation on the storage cell in the right side area of the storage cell array 11. Thus, it causes a reduced time allowance for the write operation and thus write errors during performing of the high-speed write operation.

In view of this, an embodiment of the disclosure provides another memory.

Figure 4:
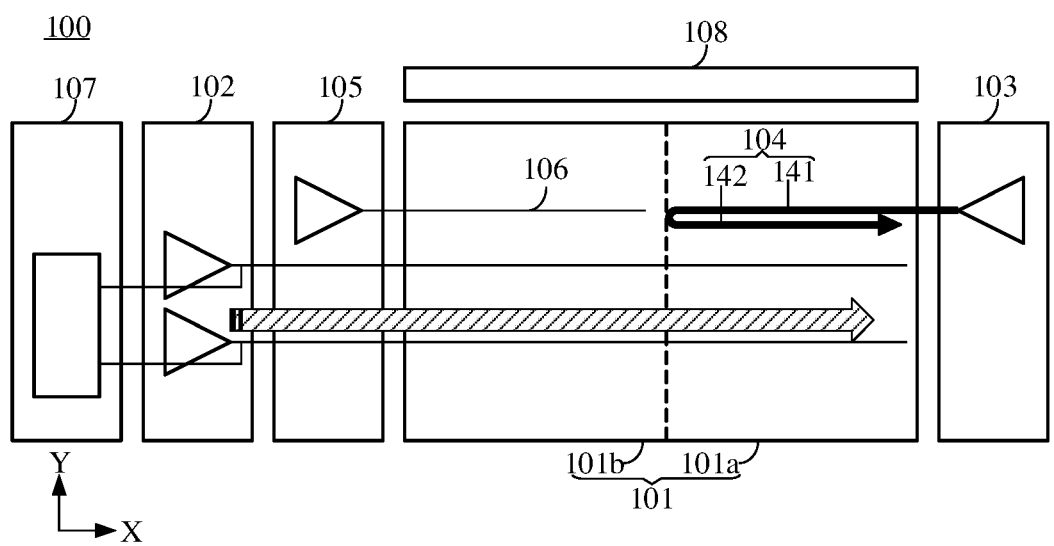
FIG. 4 is a schematic structural diagram of a memory according to an embodiment of the disclosure.

Referring to FIG. 4, FIG. 4 is a schematic structural diagram of a memory according to an embodiment of the disclosure. As shown in FIG. 4, the memory 100 may include: a storage cell array 101, a write driver 102, a first column decoder 103 and a first column selection line 104.

The write driver 102 is coupled to the storage cell array 101 and is configured to transmit a data signal to be written to the storage cell array 101 according to a received write operation command.

The first column decoder 103 is coupled to a first storage cell area 101a of the storage cell array 101 through a first column selection line 104 and is configured to perform a write operation on the storage cell array 101a.

The first column selection line 104 may include a dummy route 141 and a loaded route 142.

The dummy route 141 is coupled to the first column decoder 103 and the loaded route 142 and is configured to transmit a first column selection signal to the loaded route 142.

The loaded route 142 is coupled to the first storage cell area 101a and is configured to transmit the first column selection signal to the first storage cell area 101a; the first column selection signal is configured to select a storage cell column, on which a write operation is performed, from the first storage cell area 101a.

Herein, a transmission direction of the data signal to be written transmitted by the write driver 102 is identical to a transmission direction of the first column selection signal transmitted via the loaded route 142.

It is to be noted that the memory 100 may include the storage cell array 101, the write driver 102, the first column decoder 103 and the second column decoder 105. The embodiment is illustrated by taking a condition that the write driver 102, the second column decoder 105, the storage cell array 101 and the first column decoder 103 are successively arranged in the first direction, and the right side area of the storage cell array 101 is the first storage cell area 101a in FIG. 4 as an example. However, an arrangement mode of components provided by the disclosure is not limited thereto. The arranging order of the write driver 102, the second column decoder 105, the storage cell array 101 and the first column decoder 103 is variable, which is not limited in the embodiment. The second column decoder 105, the write driver 102, the storage cell array 101 and the first column decoder 103 are successively arranged along the positive X axis direction or arranged along other directions, which may also realize the disclosure.

Exemplarily, referring to FIG. 4, the write driver 102 and the first column decoder 103 are respectively located on two opposite sides of the storage cell array 101. The first column decoder 103 is coupled to the storage cell array 101 via the first column selection line 104, and the first column selection line 104 may include the dummy route 141 and the loaded route 142.

In an actual application, in a case where an write operation instruction is received, the write operation is performed on the first storage cell area 101a of the storage cell array 101 by the write driver 102 and the first column decoder 103. Exemplarily, an inputted column address obtained by decoding the write operation instruction is transmitted to the first column decoder 103. The first column decoder 102 may decode the inputted column address and may generate a first column selection signal based on a decoding result. The first column decoder 102 transmits the first column selection signal, so as to select a storage cell corresponding to the inputted column address to perform the write operation.

As shown in FIG. 4, the write driver 102 drives the storage cell array 101 along the positive X axis direction, the dummy route 141 transmits the first column selection signal to the loaded route 142 along the negative X axis direction in the first storage cell area 101a, and the loaded route 142 drives the first storage cell area 101a of the storage cell array 101 along the positive X axis direction according to the first column selection signal. Specifically, the write driver 102 transmits the data signal to be written to the first storage cell area 101a along the positive X axis direction, and the dummy route 141 transmits the first column selection signal to the loaded route 142 along the negative X axis direction in the first storage cell area 101a. The write driver 102 continuously transmits the data signal to be written to the first storage cell area 101a along the positive X axis direction, and the loaded route 142 transmits the first column selection signal in the first storage cell area 101a along the negative X axis direction. Thus, as shown in FIG. 4, in the first storage cell area 101a, the transmission direction of the data signal to be written transmitted by the write driver 102 is identical to the transmission direction of the first column selection signal transmitted via the loaded route 142, both the two transmission directions are the positive X axis direction.

Figure 5:
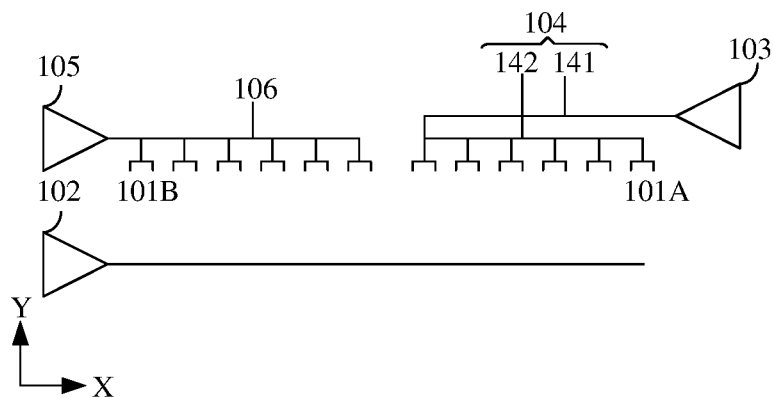
FIG. 5 is an enlarged schematic diagram of a partial structure of the memory structure according to FIG. 4.

FIG. 5 is a partial schematic diagram of FIG. 4. Referring to FIG. 5, the first column selection line 104 may include the dummy route 141 and the loaded route 142. Herein, the dummy route 141 is located in the right side area of the storage cell array 101 and is not coupled to the storage cell, and the loaded route 142 is located in the right side area of the storage cell array 101 and coupled to the storage cells in the right side area of the storage cell array 101. In an example, the first column selection line 104 is divided into two equaling selection lines, and the dummy route 141 and the loaded route 142 are equal in length. In another example, the first column selection line 104 is divided into the dummy route 141 and the loaded route 142 according to the number of the storage cells. Herein, the dummy route 141 passes through M1 storage cells, and the loaded route 142 is coupled to N1 storage cells. M1 is equal to N1. In another example, the first column selection line 104 is divided into the dummy route 141 and the loaded route 142 according to a transmission speed. Herein, the transmission speed of the first column selection signal on the dummy route 141 is M2, and the transmission speed of the first column selection signal on the loaded route 142 is N2. For example, under a circumstance that both a transmission time of the first column selection signal passing through the dummy route 141 and a transmission time of the first column selection signal passing through the loaded route 142 remain unchanged, if the transmission speed M2 is greater than the transmission speed N2, the dummy route 141 may be set to be longer than the loaded route 142; if the transmission speed M2 is lower than the transmission speed N2, the dummy route 141 may be set to be shorter than the loaded route 142. It is to be noted that they are only examples for division of the dummy route 141 and the loaded route 142, and the disclosure is not limited to the above-mentioned division modes.

In a case where the write operation is performed on the storage cell array 101 by the write driver 102 and the first column decoder 103 located on the two opposite sides of the storage cell array 101, since the transmission direction of the data signal to be written transmitted by the write driver 102 is identical to the transmission direction of the first column selection signal transmitted via the loaded route 142, both the two transmission directions are the positive X axis direction. In a writing process shown in FIG. 4, both the transmission direction of the data signal to be written and the transmission direction of the first column selection signal are the positive X axis direction in the first storage cell area 101a, so that the consistency of the write operation may be improved.

Compared with the problem of poor time sequence performance because the transmission direction of the data signal to be written and the transmission direction of the first column selection signal are opposite, in the memory provided by the embodiments of the disclosure, in a case where data are written into the storage cell area 101a by the write driver 102 and the first column decoder 103, since the transmission direction of the data signal to be written transmitted by the write driver 102 is identical to the transmission direction of the first column selection signal transmitted via the loaded route 142, and the transmission time sequence may further be regulated via the dummy route, the consistency of the write operation may be improved and the time allowance for the write operation may be increased, so that the problems of write errors during a high-speed write operation are avoided, and therefore, the performance of the memory is improved.

In some embodiments, referring to FIG. 4, the storage cell array 101 may include a second storage cell area 101b and a first storage cell area 101a arranged in parallel along a first direction, the first direction is a direction along which the write driver 102, the storage cell array 101 and the first column decoder 103 are successively arranged. The storage cell array 101 further includes a dummy route 141 and a loaded route 142.

The dummy route 141 is located in the first storage cell area 101a and configured to transmit the first column selection signal to the loaded route 142 in a second direction opposite to the first direction.

The loaded route 142 is coupled to the first storage cell area 101a and configured to transmit the first column selection signal to the first storage cell area 101a, The first column selection signal is configured to select a storage cell column, on which a write operation is performed, from the first storage cell area 101a.

As shown in FIG. 4, the storage cell array 101 is divided into the first storage cell area 101a and the second storage cell area 101b symmetrical about a center dotted line (shown in FIG. 4). The first storage cell area 101a is the right side area of the storage cell array 101, and the second storage cell area 101b is the left side area of the storage cell array 101. It is to be noted that it is only an example of division of the storage cell array 101, and the disclosure is not limited to the above-mentioned division mode.

Exemplarily, the first column selection signal may be generated by the first column decoder 103. In an example, referring to FIG. 4, the first column decoder 103 may decode the inputted column address and may generate the first column selection signal based on a decoding result. The first column decoder 103 may transmit the first column selection signal in the first storage cell area 101a via the first column selection line 104, so as to select the storage cell corresponding to the inputted column address. The first column decoder 103 may drive, select or activate the dummy route 141 along the negative X axis direction, and may drive, select or activate the loaded route 142 along the positive X axis direction.

Specifically, the write driver 102, the storage cell array 101 and the first column decoder 103 are successively arranged along the positive X axis direction, the dummy route 141 is located in the first storage cell area 101a and is not coupled to the storage cells in the first storage cell area 101a, and the loaded route 142 is located in the first storage cell area 101a and is coupled to the storage cells in the first storage cell area 101a.

The write driver 102 transmits the data signal to be written in the first storage cell area 101a along the positive X axis direction, and the dummy route 141 transmits the first column selection signal along the negative X axis direction in the first storage cell area 101a. The data signal to be written is continuously transmitted in the first storage cell area 101a along the positive X axis direction, and the first column selection signal is transmitted via the loaded route 142 in the first storage cell area 101a along the negative X axis direction. Thus, in the first storage cell area 101a, the transmission direction of the data signal to be written transmitted by the write driver 102 is identical to the transmission direction of the first column selection signal transmitted via the loaded route 142, both the two transmission direction are the positive X axis direction. Therefore, the consistency of the write operation in the first storage cell area 101a may be improved, so that the write errors during high-speed write operation are avoided.

In some embodiments, referring to FIG. 4, the memory may further include the second column decoder 105. The second column decoder and the first column decoder 103 are located on the two opposite sides of the storage cell array 101. The second column decoder and the write driver 102 are located on the same side of the storage cell array 101.

The second column decoder 105 is coupled to the second storage cell area 101b and is configured to perform a write operation on the second storage cell area 101b.

As shown in FIG. 4, the write driver 102, the second column decoder 105, the storage cell array 101 and the first column decoder 103 are successively arranged in the positive X axis direction. In addition, the arranging order of the write driver 102, the second column decoder 105, the storage cell array 101 and the first column decoder 103 is variable, which is not limited in the embodiment.

Specifically, the second column selection signal may be generated by the second column decoder 105. In an example, referring to FIG. 4, the second column decoder 105 may decode the inputted column address and may generate the second column selection signal based on a decoding result. The second column decoder 105 may transmit the second column selection signal in the first storage cell area 101a, so as to select a storage cell corresponding to the inputted column address. The write driver 102 drives the second storage cell area 101b along the positive X axis direction, and the second column decoder 105 transmits the second column selection signal in the second storage cell area 101b along the positive X axis direction. Thus, the transmission direction of the data signal to be written transmitted by the write driver 102 is identical to the transmission direction of the second column selection signal transmitted by the second column decoder 105, both the two transmission directions are the positive X axis direction. Therefore, the consistency of the write operation in the second storage cell area 101b may be improved, so that the write errors during high-speed write operation are avoided.

Figure 6:
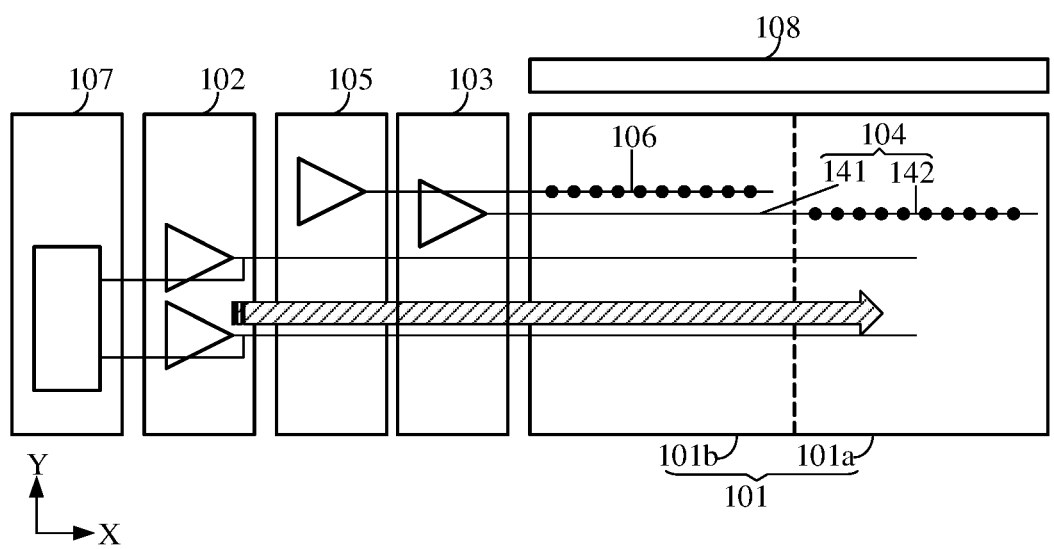
FIG. 6 is a schematic diagram of another read operation for a memory according to an embodiment of the disclosure.

In some embodiments, referring to FIG. 6, the storage cell array 101 may include a second storage cell area 101b and a first storage cell area 101a arranged in parallel along a first direction, the first direction is a direction along which the write driver 102, the first column decoder 103 and the storage cell array 101 are successively arranged. The storage cell array 101 further includes a dummy route 141 and a loaded route 142.

The dummy route 141 is located in the second storage cell area 101b and configured to transmit the first column selection signal to the loaded route 142 in the first direction.

The loaded route 142 is coupled to the first storage cell area 101a and configured to transmit the first column selection signal to the first storage cell area 101a. The first column selection signal is configured to select a storage cell column, on which a write operation is performed, from the first storage cell area 101a.

It is to be noted that the embodiment is illustrated by taking a condition that the write driver 102, the second column decoder 105, the first column decoder 103 and the storage cell array 101 shown in FIG. 6 are successively arranged in the positive X axis direction as an example. In addition, the arrangement order of the write driver 102, the second column decoder 105, the storage cell array 103 and the first column decoder 101 is variable, which is not limited in the embodiment. As shown in FIG. 6, the storage cell array 101 is divided into the first storage cell area 101a and the second storage cell area 101b which are symmetrical about a center dotted line (shown in FIG. 6). The first storage cell area 101a is the right side area of the storage cell array 101, and the second storage cell area 101b is the left side area of the storage cell array 101. It is to be noted that it is only an example of division of the storage cell array 101, and the disclosure is not limited to the above-mentioned division mode. For example, the storage cell array may further be divided according to the transmission speeds of the signals on the dummy route and the loaded route.

In an example, as shown in FIG. 6, the first column decoder 103 drives the storage cell array via the first column selection line 104. The first column selection line 104 may include the dummy route 141 and the loaded route 142. Herein, the dummy route 141 is located in the second storage cell area 101b and is not coupled to the storage cell, and the loaded route 142 is located in the first storage cell area 101a and coupled to the storage cells in the first storage cell area 101a. The second column decoder 105 drives the storage cell array via the second column selection line 106. The second column selection line 106 may include a second dummy route and a second loaded route. Herein, the second loaded route is located in the second storage cell area 101b and is coupled to the storage cells in the second storage cell area 101b, and the second dummy route is located in the first storage cell area 101a and is not coupled to the storage cell. In another example, the first column decoder 103 drives the storage cell array via the first columns selection line 104. Herein, the loaded route 142 is located in the second storage cell area 101b and is coupled to the storage cells in the second storage cell area 101b, and the dummy route 141 is located in the first storage cell area 101a and is not coupled to the storage cell. The second column decoder 105 drives the storage cell array via the second column selection line 106. The second column selection line 106 may include a second dummy route and a second loaded route. Herein, the second dummy route is located in the second storage cell area 101b and is not coupled to the storage cell, and the second loaded route is located in the first storage cell area 101a and is coupled to the storage cells in the first storage cell area 101a.

In an actual application, when a write operation instruction is received, the write driver 102 and the first column decoder 103 perform the write operation on the storage cell array 101. As shown in FIG. 6, the write driver 102 drives the storage cell array 101 along the positive X axis direction, the dummy route 141 and the loaded route 142 drive the storage cell array 101 along the positive X axis direction. Specifically, the write driver 102 transmits the data signal to be written along the positive X axis direction, and the dummy route 141 transmits the first column selection signal along the positive X axis direction. The write driver 102 continuously transmits the data signal to be written in the first storage cell area 101a along the positive X axis direction, and the loaded route 142 transmits the first column selection signal in the first storage cell area 101a along the positive X axis direction. Thus, the transmission direction of the data signal to be written transmitted by the write driver 102 is identical to the transmission direction of the first column selection signal transmitted via the loaded route 142, both the two transmission directions are the positive X axis direction. Therefore, in a case where the write driver 102 and the first column decoder 103 are located on the same side of the storage cell array 101, the write operation is performed by the write driver 102 and the first column decoder 103, and the transmission direction of the data signal to be written is identical to the transmission direction of the first column selection signal, both the two transmission directions are the positive X axis direction. Therefore, the consistency of the write operation may be improved, so that the write errors during high-speed write operation are avoided.

In some embodiments, referring to FIG. 6, the memory may further include a second column decoder 105. The second column decoder, the first column decoder 103 and the write driver 102 are located on the same side of the storage cell array 101.

The second column decoder 105 is coupled to the second storage cell area 101b and is configured to perform a write operation on the second storage cell area 101b.

As shown in FIG. 6, the write driver 102, the second column decoder 105, the first column decoder 103 and the storage cell array 101 are successively arranged in the positive X axis direction. In addition, the arrangement order of the write driver 102, the second column decoder 105, the first column decoder 103 and the storage cell array 101 is variable, which is not limited in the embodiment.

Specifically, the second column selection signal may be generated by the second column decoder 105. In an example, referring to FIG. 6, the second column decoder 105 may decode an inputted column address and may generate the second column selection signal based on a decoding result. The second column decoder 105 may transmit the second column selection signal in the second storage cell area 101b, so as to select a storage cell corresponding to the inputted column address.

The write driver 102 drives the second storage cell area 101b along the positive X axis direction, and the second column decoder 105 transmits the second column selection signal in the second storage cell area 101b along the positive X axis direction. Thus, the transmission direction of the data signal to be written transmitted by the write driver 102 is identical to the transmission direction of the second column selection signal transmitted by the second column decoder 105, both the two directions are the positive X axis direction. Therefore, in the second storage cell area 101b, in a case where the write operation is performed by the write driver 102 and the second column decoder 105, the transmission direction of the data signal to be written is identical to the transmission direction of the second column selection signal, both the two directions are the positive X axis direction. Therefore, the consistency of the write operation in the second storage cell area 101b may be improved, so that the write errors during high-speed write operation are avoided.

In some embodiments, the memory may further include a second column selection line 106, coupled to the second column decoder 105 and the second storage cell area 101b and configured to transmit a second column selection signal to the second storage cell area 101b. Herein, the second column selection signal is configured to select the storage cell column, on which the write operation is performed, from the second storage cell area 101b.

As shown in FIG. 4 or FIG. 6, the column selection signals may be generated by the first column decoder 103 and the second column decoder 105. Exemplarily, the second column decoder 105 may decode the inputted column address and may generate the second column selection signal based on a decoding result. The second column decoder 105 may transmit the second column selection signal in the first direction (the positive X axis direction shown in FIG. 4 or FIG. 6) via the second column selection line 106, so as to select a storage cell corresponding to the inputted column address. The second column decoder 105 may drive, select or activate the second column selection line 106 along the positive X axis direction. Each of the second column selection lines 106 may be connected with at least one bit line. It is to be noted that the second column selection line 106 and the mounting lines 142 in the second column selection line 104 which are coupled to the same column storage cell are a same horizontal line.

In an exemplary embodiment, the column selection signals may be generated by the command decoder. For example, the command decoder may, in response to the write operation command, generate the first column selection line signal and the second column selection line signal, and transmit the first column selection line signal to the first column decoder 103 and transmit the second column selection line signal to the second column decoder 105.

Figure 7:
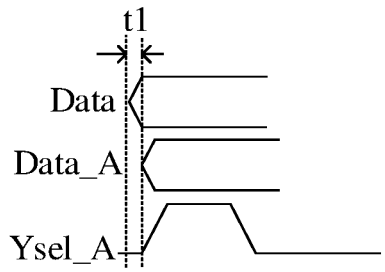
FIG. 7 is a schematic diagram of a timing of a write operation for a memory according to an embodiment of the disclosure.

It is to be noted that referring to FIG. 5 and FIG. 7, the write driver 102 drives a storage cell 101B along the positive X axis direction, and the write driver 102 may transmits the data signal to be written (Data shown in FIG. 7) to the storage cell 101B via a data input line (GIO). The second column decoder 105 transmits the second column selection signal (Ysel_A in FIG. 7) to the storage cell 101B along the positive X axis direction. The second column decoder 105 sends the second column selection signal, and the storage cell 101B almost simultaneously receives the data signal to be written (Data_A in FIG. 7) and the second column selection signal (Ysel_A in FIG. 7) in a time t1. The transmission direction of the data signal to be written is identical to the transmission direction of the second column selection signal, and the data signal to be written and the second column selection signal almost simultaneously arrive at the storage cell 101n. Therefore, the consistency of the write operation in the left side area of the storage cell array 101 may be improved, so that the write errors during high-speed write operation are avoided.

Figure 8:
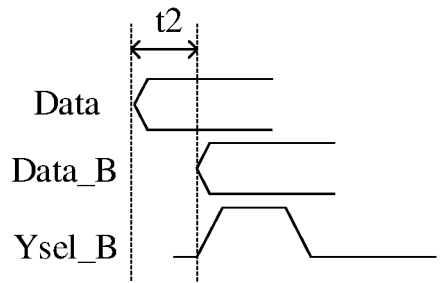
FIG. 8 is a schematic diagram of a timing of another write operation for a memory according to an embodiment of the disclosure.

Referring to FIG. 5 and FIG. 8, the write driver 102 drives a storage cell 101A along the positive X axis direction, and the write driver 102 may transmits the data signal to be written (Data shown in FIG. 8) to the storage cell 101A via a data input line (GIO). The first column decoder 103 transmits the first column selection signal along the negative X axis direction via the dummy route 141, the first column selection signal turns back when arriving at a boundary of the dummy route 141 and the loaded route 142, and then the first column selection signal (Ysel_B in FIG. 8) is transmitted to the storage cell 101A along the positive X axis direction via the loaded route 142. The storage cell 101A almost simultaneously receives the data signal to be written (Data_B in FIG. 8) and the first column selection signal (Ysel_B in FIG. 8) in a time t2, and the transmission direction of the data signal to be written is identical to the transmission direction of the first column selection signal, and the data signal to be written and the first column selection signal almost simultaneously arrive at the storage cell 101A. Therefore, the consistency of the write operation in the right side area of the storage cell array 101 may be improved, so that the write errors during high-speed write operation are avoided.

In some embodiments, the memory may further include a command decoder, coupled to the first column decoder 103 and configured to control the first column decoder 103 according to a received write operation command, to perform the write operation.

Exemplarily, in response to a command (CMD) and an address (ADD) externally received from the memory 100, the command (CMD) decoder (not shown) may control the first column decoder 103, the second column decoder 105 and the row decoder 108.

In an example, in response to the write operation command or the read operation command, the command decoder may control the first column decoder 103 and the second column decoder 105, and may transmit the inputted column address to the first column decoder 103 and the second column decoder 105.

In an exemplary embodiment, in response to the write operation command, the read operation command, an activation command, a precharging command, a refreshing command and the like, the command decoder may further control the row decoder 108, and may transmit the inputted row address to the row decoder 108.

In some embodiments, the memory may include a DRAM.

It is to be noted that the memory may include the DRAM. The memory may further include other types of memories. For example, Static Random Access Memory (SRAM), a NAND flash, a NOR flash, a Resistive Random Access Memory (RRAM), a Ferroelectric Random Access Memory (FRAM), a Phase Change Random Access Memory (PRAM), a Thyristor Random Access Memory (TRAM) and a Magnetic Random Access Memory (MRAM). It is not limited in the disclosure.

In some embodiments, the memory may further include a read amplifier 107, coupled to the storage cell array 101 and configured to receive read data information outputted by the storage cell array 101 based on the read operation.

Exemplarily, in a case where a write operation instruction is received, the read operation is performed to the storage cell array 101. As shown in FIG. 4 or FIG. 6, an inputted column address obtained by decoding the write operation instruction is transmitted to the first column decoder 103 or the second column decoder 105. The first column decoder 103 or the second column decoder 105 may decode the inputted column address and may generate the second column selection signal based on a decoding result.

Referring to FIG. 4, in an example, the first column decoder 103 may transmit the second column selection signal along the negative X axis direction, so as to select a storage cell corresponding to the inputted column address to perform the read operation. A target storage cell in the storage cell column outputs the read data to the read amplifier 107 along the negative X axis direction according to the second column selection signal. In another example, the second column decoder 105 may transmit the second column selection signal along the positive X axis direction, so as to select a storage cell corresponding to the inputted column address to perform the read operation. A target storage cell in the storage cell column outputs the read data to the read amplifier 107 along the negative X axis direction according to the second column selection signal.

Referring to FIG. 6, the first column decoder 103 or the second column decoder 105 may transmit the second column selection signal along the positive X axis direction, so as to select a storage cell corresponding to the inputted column address to perform the read operation. A target storage cell in the storage cell column outputs the read data to the read amplifier 107 along the negative X axis direction according to the second column selection signal.

In some embodiments, the memory may further include a row decoder 108, coupled to the storage cell array 101. The row decoder 108 and the storage cell array 101 are arranged in a third direction. The third direction is perpendicular to the first direction.

Herein, the row decoder 108 is configured to transmit a row selection signal to the storage cell array 101, so as to select a storage unit row in the storage cell array 101 on which the write operation or the read operation is performed.

Exemplarily, referring to FIG. 4 and FIG. 6, the row decoder 108 may decode an inputted row address and may generate a row selection signal based on a decoding result. The row decoder 108 may transmit the selection signal in the third direction (the negative Y axis direction shown in FIG. 4 or FIG. 6) via the bit line, and may select a storage cell row corresponding to the inputted row address. A target storage cell is determined by selecting a storage cell column corresponding to the inputted column address and selecting a storage cell row corresponding to the inputted row address.

Referring to FIG. 4 and FIG. 6, the row decoder 108 and the storage cell array 101 are successively arranged along the third direction (the negative Y axis direction in FIG. 6). It is to be noted that FIG. 4 and FIG. 6 provide an arrangement mode in the memory. However, it is only exemplarily, and the row decoder 108 of the disclosure is not limited to the arrangement mode shown in FIG. 4 and FIG. 6.

Figure 9:
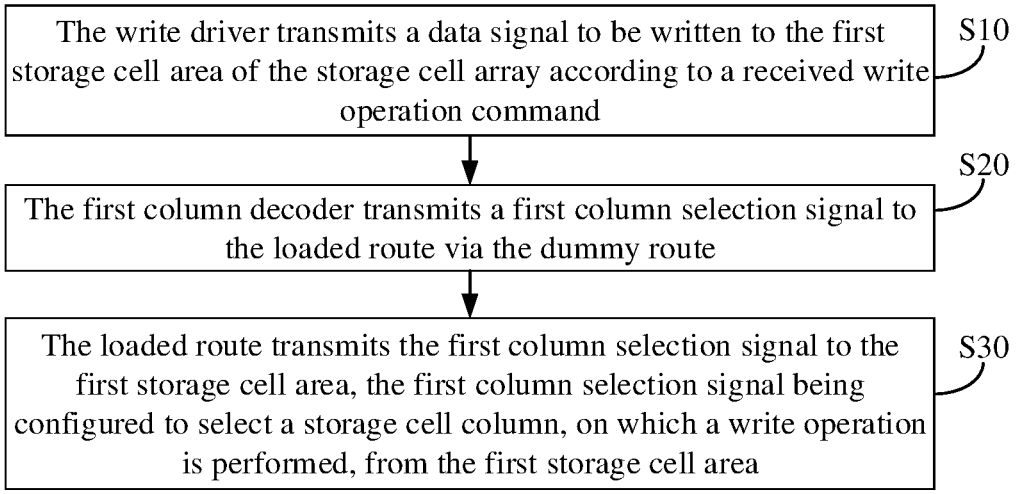
FIG. 9 is a flowchart of a method for operating a memory according to an embodiment of the disclosure.

As shown in FIG. 9, FIG. 9 is a flowchart of a method for operating a memory according to an embodiment of the disclosure. The memory may include a storage cell array, a write driver, a first column decoder and a first column selection line. The first column selection line includes a dummy route and a loaded route, and the first column decoder is coupled to the storage cell array through the dummy route and the loaded route.

The method for operating the memory may include the following operations.

At S10, the write driver transmits a data signal to be written to the first storage cell area of the storage cell array according to a received write operation command.

At S20, the first column decoder transmits a first column selection signal to the loaded route via the dummy route.

At S30, the loaded route transmits the first column selection signal to the first storage cell area. The first column selection signal is used to select a storage cell column, on which a write operation is performed, from the first storage cell area.

Herein, a transmission direction of the data signal to be written transmitted by the write driver is identical to a transmission direction of the first column selection signal transmitted via the loaded route.

It is to be noted that the memory may include the storage cell array, the write driver, the first column decoder and the second column decoder. The embodiment is illustrated by taking a condition that the write driver 102, the second column decoder 105, the storage cell array 101 and the first column decoder 103 in FIG. 4 are successively arranged in the first direction, and the right side area of the storage cell array 101 is the first storage cell area 101*a* as an example. However, an arrangement mode of a device provided by the disclosure is not limited thereto. The arranging order of the write driver 102, the second column decoder 105, the storage cell array 101 and the first column decoder 103 is variable, which is not limited in the embodiment. The second column decoder 105, the write driver 102, the storage cell array 101 and the first column decoder 103 are successively arranged along the positive X axis direction or arranged along other directions, which may also realize the disclosure.

Exemplarily, referring to FIG. 4, the write driver 102 and the first column decoder 103 are respectively located on two opposite sides of the storage cell array 101. The first column decoder 103 is coupled to the storage cell array 101 via the first column selection line 104, and the first column selection line 104 may include the dummy route 141 and the loaded route 142.

S10 is performed. When a write operation instruction is received, the write driver 102 may transmit a data signal to be written to the first storage cell area 101*a* of the storage cell array 101 via the data input line (GIO). S20-S30 are performed. An inputted column address obtained by decoding the write operation instruction is transmitted to the first column decoder. The first column decoder may decode the inputted column address and may generate the first column selection signal based on a decoding result. The first column decoder may transmit the first column selection signal along the negative X axis direction via the dummy route and then transmit the first column selection signal along the positive X axis direction via the loaded route, so as to select a storage cell corresponding to the inputted column address to perform the write operation.

Exemplarily, as shown in FIG. 4, the write driver 102 drives the storage cell array 101 along the positive X axis direction, the dummy route 141 transmits the first column selection signal to the loaded route 142 along the negative X axis direction in the first storage cell area 101*a*, and the loaded route 142 drives the first storage cell area 101*a* of the storage cell array 101 along the positive X axis direction according to the first column selection signal. Specifically, the write driver 102 transmits the data signal to be written to the first storage cell area 101*a* along the positive X axis direction, and the dummy route 141 transmits the first column selection signal to the loaded route 142 along the negative X axis direction in the first storage cell area 101*a*. The write driver 102 continuously transmits the data signal to be written to the first storage cell area 101*a* along the positive X axis direction, and the loaded route 142 transmits the first column selection signal in the first storage cell area 101*a* along the positive X axis direction. Thus, as shown in FIG. 4, in the first storage cell area 101*a*, the transmission direction of the data signal to be written transmitted by the write driver 102 is identical to the transmission direction of the first column selection signal transmitted via the loaded route 142, both the two transmission directions are the positive X axis direction.

FIG. 5 is a partial schematic diagram of FIG. 4. Referring to FIG. 5, the first column selection line 104 may include the dummy route 141 and the loaded route 142. Herein, the dummy route 141 is located in the right side area of the storage cell array 101 and is not coupled to the storage cell, and the loaded route 142 is located in the right side area of the storage cell array 101 and coupled to the storage cells in the right side area of the storage cell array 101. In an example, the first column selection line 104 is divided into two equaling selection lines, and the dummy route 141 and the loaded route 142 are equal in length. In another example, the first column selection line 104 is divided into the dummy route 141 and the loaded route 142 according to the number of the storage cells. Herein, the dummy route 141 passes through M1 storage cells, and the loaded route 142 is coupled to N1 storage cells. M1 is equal to N1. In another example, the first column selection line 104 is divided into the dummy route 141 and the loaded route 142 according to a transmission speed. Herein, the transmission speed of the first column selection signal on the dummy route 141 is M2, and the transmission speed of the first column selection signal on the loaded route 142 is N2. For example, under a circumstance that both a transmission time of the first column selection signal passing through the dummy route 141 and a transmission time of the first column selection signal passing through the loaded route 142 remain unchanged, if the transmission speed M2 is greater than the transmission speed N2, the dummy route 141 may be set to be longer than the loaded route 142; if the transmission speed M2 is lower than the transmission speed N2, the dummy route 141 may be set to be shorter than the loaded route 142. It is to be noted that they are only examples for division of the dummy route 141 and the loaded route 142, and the disclosure is not limited to the above-mentioned division mode.

In a case where the write operation is performed to the storage cell array 101 by the write driver 102 and the first column decoder 103 located on the two opposite sides of the storage cell array 101, since the transmission direction of the data signal to be written transmitted by the write driver 102 is identical to the transmission direction of the first column selection signal transmitted via the loaded route 142, both the two transmission directions are the positive X axis direction. In a writing process shown in FIG. 4, the transmission direction of the data signal to be written and the transmission direction of the first column selection signal are the positive X axis direction in the first storage cell area 101a, so that the consistency of the write operation may be improved. For the problem of poor time sequence performance because the transmission direction of the data signal to be written and the transmission direction of the column selection signal are opposite, in the embodiments of the disclosure, the write driver transmits the data signal to be written to the storage cell array according to the received write operation command, the first column decoder transmits the first column selection signal to the loaded route via the dummy route, the loaded route transmits the first column selection signal to the storage cell array, herein, the first column selection signal is configured to select the storage cell column, on which the write operation is performed, from the storage cell array and the transmission direction of the data signal to be written is identical to the transmission direction of the first column selection signal transmitted via the loaded route. Since the transmission direction of the data to be written transmitted by the write driver 102 is identical to the transmission direction of the first column selection signal transmitted via the loaded route 142, and the transmission time sequence may further be regulated by means of the dummy route, the consistency of the write operation may be improved and the time allowance for the write operation may be increased, so that the problems of write errors during a high-speed write operation are avoided, and therefore, the performance of the memory is improved.

In some embodiments, the memory cell array may include a second storage cell area and the first storage cell area arranged in parallel along a first direction. The first direction is a direction along which the write driver, the storage cell array and the first column decoder are successively arranged. The method may include the following operations.

The first column decoder transmits the first column selection signal to the loaded route in the second direction opposite to the first direction via the dummy route; herein, the dummy route is located in the first storage cell area.

The loaded route transmits the first column selection signal to the first storage cell area in the first direction; herein, the loaded route is coupled to the first storage cell area, and the first column selection signal is configured to select the storage cell column, on which the write operation is performed, from the first storage cell area.

As shown in FIG. 4, the storage cell array 101 is divided into the first storage cell area 101a and the second storage cell area 101b which are symmetrical about a center dotted line (shown in FIG. 4). The first storage cell area 101a is the right side area of the storage cell array 101, and the second storage cell area 101b is the left side area of the storage cell array 101. It is to be noted that it is only an example of division of the storage cell array 101, and the disclosure is not limited to the above-mentioned division mode. For example, the storage cell array may also be divided according to the transmission speeds of the signals on the dummy route and the loaded route.

Exemplarily, the first column selection signal may be generated by the first column decoder 103. In an example, referring to FIG. 4, the first column decoder 103 may decode the inputted column address and may generate the first column selection signal based on a decoding result. The first column decoder 103 may transmit the first column selection signal in the first storage cell area 101a via the first column selection line 104, so as to select the storage cell corresponding to the inputted column address. The first column decoder 103 may drive, select or activate the dummy route 141 along the negative X axis direction, and may drive, select or activate the loaded route 142 along the positive X axis direction.

Specifically, the write driver 102, the storage cell array 101 and the first column decoder 103 are successively arranged along the positive X axis direction, the dummy route 141 is located in the first storage cell area 101a and is not coupled to the storage cells in the first storage cell area 101a, and the loaded route 142 is located in the first storage cell area 101a and is coupled to the storage cells in the first storage cell area 101a.

The write driver 102 transmits the data signal to be written in the first storage cell area 101a along the positive X axis direction, and the dummy route 141 transmits the first column selection signal along the negative X axis direction in the first storage cell area 101a. The data signal to be written is continuously transmitted in the first storage cell area 101a along the positive X axis direction, and the first column selection signal is transmitted via the loaded route 142 in the first storage cell area 101a along the positive X axis direction. Thus, in the first storage cell area 101a, the transmission direction of the data signal to be written transmitted by the write driver 102 is identical to the transmission direction of the first column selection signal transmitted via the loaded route 142, both the transmission directions are the positive X axis direction. Therefore, the consistency of the write operation in the first storage cell area 101a may be improved, so that the write errors during high-speed write operation are avoided.

In some embodiments, the memory may further include a second column decoder, the second column decoder and the first column decoder are located on two opposite sides of the storage cell array, and the second column decoder and the write driver are located on a same side of the storage cell array.

The method may further include the following operations.

The second column decoder performs a write operation on the second storage cell area.

As shown in FIG. 4, the write driver 102, the second column decoder 105, the storage cell array 101 and the first column decoder 103 are successively arranged in the positive X axis direction. In addition, the arranging order of the write driver 102, the second column decoder 105, the storage cell array 101 and the first column decoder 103 is variable, which is not limited in the embodiment.

Specifically, the second column selection signal may be generated by the second column decoder 105. In an example, referring to FIG. 4, the second column decoder 105 may decode an inputted column address and may generate a second column selection signal based on a decoding result. The second column decoder 105 may transmit the second column selection signal in the second storage cell area 101b, so as to select a storage cell corresponding to the inputted column address. The write driver 102 drives the second storage cell area 101b along the positive X axis direction, and the second column decoder 105 transmits the second column selection signal in the second storage cell area 101b along the positive X axis direction. Thus, the transmission direction of the data signal to be written transmitted by the write driver 102 is identical to the transmission direction of the second column selection signal transmitted by the second column decoder 105, both the two transmission directions are the positive X axis direction. Therefore, the consistency of the write operation in the second storage cell area 101b may be improved, so that the write errors during high-speed write operation are avoided.

In some embodiments, the memory cell array may include the second storage cell area and the first storage cell area which are arranged in parallel along the first direction. Herein, the first direction is the direction along which the write driver, the first column decoder and the storage cell array are successively arranged. The method may include the following operations.

The first column decoder transmits the first column selection signal to the loaded route in the first direction via the dummy route; herein, the dummy route is located in the second storage cell area.

The loaded route transmits the first column selection signal to the first storage cell area in the first direction; herein, the loaded route is coupled to the first storage cell area, and the first column selection signal is configured to select a storage cell column, on which the write operation is performed, from the first storage cell area.

It is to be noted that the embodiment is illustrated by taking a condition that the write driver 102, the second column decoder 105, the first column decoder 103 and the storage cell array 101 shown in FIG. 6 are successively arranged in the positive X axis direction as an example. In addition, the arrangement order of the write driver 102, the second column decoder 105, the storage cell array 103 and the first column decoder 101 is variable, which is not limited in the embodiment. As shown in FIG. 6, the storage cell array 101 is divided into the first storage cell area 101a and the second storage cell area 101b which are symmetrical about a center dotted line (shown in FIG. 6). The first storage cell area 101a is the right side area of the storage cell array 101, and the second storage cell area 101b is the left side area of the storage cell array 101. It is to be noted that it is only an example of division of the storage cell array 101, and the disclosure is not limited to the above-mentioned division mode.

In an example, as shown in FIG. 6, the first column decoder 103 drives the storage cell array via the first column selection line 104. The first column selection line 104 may include a dummy route 141 and a loaded route 142. Herein, the dummy route 141 is located in the second storage cell area 101b and is not coupled to the storage cell, and the loaded route 142 is located in the first storage cell area 101a and coupled to the storage cells in the first storage cell area 101a. The second column decoder 105 drives the storage cell array via the second column selection line 106. The second column selection line 106 may include a second dummy route and a second loaded route. Herein, the second loaded route is located in the second storage cell area 101b and is coupled to the storage cells in the second storage cell area 101b, and the second dummy route is located in the first storage cell area 101a and is not coupled to the storage cell. In another example, the first column decoder 103 drives the storage cell array via the first columns selection line 104. Herein, the loaded route 142 is located in the second storage cell area 101b and is coupled to the storage cells in the second storage cell area 101b, and the dummy route 141 is located in the first storage cell area 101a and is not coupled to the storage cell. The second column decoder 105 drives the storage cell array via the second column selection line 106. The second column selection line 106 may include a second dummy route and a second loaded route. Herein, the second dummy route is located in the second storage cell area 101b and is not coupled to the storage cell, and the second loaded route is located in the first storage cell area 101a and is coupled to the storage cells in the first storage cell area 101a.

In an actual application, when the write operation instruction is received, the write driver 102 and the first column decoder 103 perform the write operation on the storage cell array 101. As shown in FIG. 6, the write driver 102 drives the storage cell array 101 along the positive X axis direction, the dummy route 141 and the loaded route 142 drive the storage cell array 101 along the positive X axis direction. Specifically, the write driver 102 transmits the data signal to be written along the positive X axis direction, and the dummy route 141 transmits the first column selection signal along the positive X axis direction. The write driver 102 continuously transmits the data signal to be written in the first storage cell area 101a along the positive X axis direction, and the loaded route 142 transmits the first column selection signal in the first storage cell area 101a along the positive X axis direction. Thus, the transmission direction of the data signal to be written transmitted by the write driver 102 is identical to the transmission direction of the first column selection signal transmitted via the loaded route 142, both the two transmission directions are the positive X axis direction. Therefore, in a case where the write driver 102 and the first column decoder 103 are located on the same side of the storage cell array 101, the write operation is performed by the write driver 102 and the first column decoder 103, and the transmission direction of the data signal to be written is identical to the transmission direction of the first column selection signal, both the two transmission directions are the positive X axis direction. Therefore, the consistency of the write operation may be improved, so that the write errors during high-speed write operation are avoided.

In some embodiments, the memory may further include the second column decoder. The second column decoder, the first column decoder and the write driver are located on a same side of the storage cell array.

The method may further include the following operation.

The second column decoder performs a write operation on the second storage cell area.

As shown in FIG. 6, the write driver 102, the second column decoder 105, the first column decoder 103 and the storage cell array 101 are successively arranged in the positive X axis direction. In addition, the arrangement order of the write driver 102, the second column decoder 105, the first column decoder 103 and the storage cell array 101 is variable, which is not limited in the embodiment.

Specifically, the second column selection signal may be generated by the second column decoder 105. In an example, referring to FIG. 6, the second column decoder 105 may decode an inputted column address and may generate the second column selection signal based on a decoding result. The second column decoder 105 may transmit the second column selection signal in the second storage cell area 101b, so as to select the storage cell corresponding to the inputted column address.

The write driver 102 drives the second storage cell area 101b along the positive X axis direction, and the second column decoder 105 transmits the second column selection signal in the second storage cell area 101b along the positive X axis direction. Thus, the transmission direction of the data signal to be written transmitted by the write driver 102 is identical to the transmission direction of the second column selection signal transmitted by the second column decoder 105, both the two directions are the positive X axis direction. Therefore, in the second storage cell area 101b, in a case where the write operation is performed by the write driver 102 and the second column decoder 105, the transmission direction of the data signal to be written is identical to the transmission direction of the second column selection signal, both the two directions are the positive X axis direction. Therefore, the consistency of the write operation in the second storage cell area 101b may be improved, so that the write errors during high-speed write operation are avoided.

In some embodiments, the memory may further include a second column selection line.

The second column decoder performs a write operation on the second storage cell area, which may include the following operation.

The second column selection signal is transmitted to the second storage cell area via the second column selection line, herein, the second column selection signal is configured to select a storage cell column, on which the write operation is performed, from the second storage cell area.

As shown in FIG. 4 or FIG. 6, the column selection signals may be generated by the first column decoder 103 and the second column decoder 105. Exemplarily, the second column decoder 105 may decode the inputted column address and may generate the second column selection signal based on a decoding result. The second column decoder 105 may transmit the second column selection signal in the first direction (the positive X axis direction shown in FIG. 4 or FIG. 6) via the second column selection line 106, so as to select the storage cell corresponding to the inputted column address. The second column decoder 103 may drive, select or activate the second column selection line 106 along the positive X axis direction. Each of the second column selection lines 106 may be connected with at least one bit line. It is to be noted that the second column selection line 106 and the mounting lines 142 in the second column selection line 104 coupled to the same column storage cell are a same horizontal line.

In an exemplary embodiment, the column selection signals may be generated by the command decoder. For example, the command decoder may, in response to the write operation command, generate the first column selection line signal and the second column selection line signal, and transmit the first column selection line signal to the first column decoder 103 and transmit the second column selection line signal to the second column decoder 105.

It is to be noted that referring to FIG. 5 and FIG. 7, the write driver 102 drives a storage cell 101B along the positive X axis direction, and the write driver 102 may transmits the data signal to be written (Data shown in FIG. 7) to the storage cell 101B by a data input line (GIO). The second column decoder 105 transmits the second column selection signal (Ysel_A in FIG. 7) to the storage cell 101B along the positive X axis direction. The second column decoder 105 sends the second column selection signal, and the storage cell 101B almost simultaneously receives the data signal (Data_A in FIG. 7) to be written and the second column selection signal (Ysel_A in FIG. 7) in a time t1, and the transmission direction of the data signal to be written is identical to the transmission direction of the second column selection signal, and the data signal to be written and the second column selection signal almost simultaneously arrive at the storage cell 101n. Therefore, the consistency of the write operation in the left side area of the storage cell array 101 may be improved, so that the write errors during high-speed write operation are avoided.

Referring to FIG. 5 and FIG. 8, the write driver 102 drives a storage cell 101A along the positive X axis direction, and the write driver 102 may transmits the data signal to be written (Data shown in FIG. 8) to the storage cell 101A via a data input line (GIO). The first column decoder 103 transmits the first column selection signal along the negative X axis direction by the dummy route 141, the first column selection signal turns back when arriving at a boundary of the dummy route 141 and the loaded route 142, and then the first column selection signal (Ysel_B in FIG. 8) is transmitted to the storage cell 101A along the positive X axis direction via the loaded route 142. The storage cell 101A almost simultaneously receives the data signal to be written (Data_B in FIG. 8) and the first column selection signal (Ysel_B in FIG. 8) in a time t2, and the transmission direction of the data signal to be written is identical to the transmission direction of the first column selection signal, and the data signal to be written and the first column selection signal almost simultaneously arrive at the storage cell 101A. Therefore, the consistency of the write operation in the right side area of the storage cell array 101 may be improved, so that the write errors during high-speed write operation are avoided.

In some embodiments, the memory may further include a command decoder. The operating method may further include the following operation.

The command decoder controls the first column decoder according to a received write operation command, to perform the write operation.

Exemplarily, in response to a command (CMD) and an address (ADD) externally received from the memory 100, the command (CMD) decoder may control the first column decoder 103, the second column decoder 105 and the row decoder 108.

In an example, in response to the write operation command or the read operation command, the command decoder may control the first column decoder 103 and the second column decoder 105, and may transmit the inputted column address to the first column decoder 103 and the second column decoder 105.

In an exemplary embodiment, in response to the write operation command, the read operation command, an activation command, a precharging command, a refreshing command and the like, the command decoder may further control the row decoder 108, and may transmit the inputted row address to the row decoder 108.

It is to be noted that the memory may further include a read amplifier and a row decoder. A specific operating method may refer to the embodiments of the abovementioned memory, which is not described in detail herein.

In the embodiments of the disclosure, a write driver is coupled to a storage cell array, and transmits a data signal to be written to the storage cell array according to a received write operation command. A first column decoder is coupled to the storage cell array via a dummy route and a loaded route and transmits a first column selection signal to select a storage cell column, on which the write operation is performed, from the storage cell array. In a case where data are written into the storage cells via the write driver and the first column decoder, since a transmission direction of the data signal to be written is identical to a transmission direction of the first column selection signal transmitted via the loaded route, the consistency of the write operation may be improved and the time allowance of the write operation may be increased, so that the problems of write errors during a high-speed write operation are avoided, and therefore, the performance of the memory is improved.

It is to be understood that "an embodiment" or "some embodiments" mentioned in the whole specification means that specific features, structures or characteristics related to the embodiment are included in at least one embodiment of the disclosure. Therefore, "in an embodiment" or "in some embodiments" appearing in the whole specification does not always refer to a same embodiment. In addition, these specific features, structures or characteristics may be combined in one or more embodiments freely as appropriate. It is to be understood that, in various embodiments of the disclosure, a magnitude of a sequence number of each process does not mean an execution sequence and the execution sequence of each process should be determined by its function and an internal logic and should not form any limit to an implementation process of the embodiments of the disclosure. The above sequence numbers of the embodiments of the present disclosure are only for description, and do not represent the advantages or disadvantages of the embodiments.

The above are only the specific implementation modes of the present disclosure and not intended to limit the scope of protection of the present disclosure. Any variations or replacements apparent to those skilled in the art within the technical scope disclosed by the disclosure shall fall within the scope of protection of the present disclosure.

What is claimed is:

1. A memory, comprising:
   a storage cell array;
   a write driver, coupled to the storage cell array and configured to transmit a data signal to be written to the storage cell array according to a received write operation command; and
   a first column decoder, coupled to a first storage cell area of the storage cell array via a first column selection line and configured to perform a write operation on the storage cell array,
   the first column selection line comprising a dummy route and a loaded route;
   the dummy route being coupled to the first column decoder and the loaded route and being configured to transmit a first column selection signal to the loaded route,
   the loaded route being coupled to the first storage cell area and being configured to transmit the first column selection signal to the first storage cell area, the first column selection signal being configured to select a storage cell column, on which the write operation is performed, from the first storage cell area,
   wherein a transmission direction of the data signal to be written transmitted by the write driver is identical to a transmission direction of the first column selection signal transmitted via the loaded route;
   wherein the memory cell array comprises a second storage cell area and the first storage cell area arranged in parallel along a first direction, wherein the first direction is a direction along which the write driver, the storage cell array and the first column decoder are successively arranged,
   the dummy route is located in the first storage cell area and is configured to transmit the first column selection signal to the loaded route in a second direction opposite to the first direction, and
   the loaded route is coupled to the first storage cell area and is configured to transmit the first column selection signal to the first storage cell area in the first direction, wherein the first column selection signal is configured to select the storage cell column, on which the write operation is performed, from the first storage cell area.

2. The memory of claim 1, wherein the memory further comprises a second column decoder, the second column decoder and the first column decoder being located on two opposite sides of the storage cell array, and the second column decoder and the write driver being located on a same side of the storage cell array, wherein the second column decoder is coupled to the second storage cell area and is configured to perform a write operation on the second storage cell area.

3. The memory of claim 2, wherein the memory further comprises a second column selection line which is coupled to the second column decoder and the second storage cell area, and is configured to transmit a second column selection signal to the second storage cell area, wherein the second column selection signal is configured to select a storage cell column, on which the write operation is performed, from the second storage cell area.

4. The memory of claim 1, further comprising:
   a command decoder, coupled to the first column decoder and configured to control, according to the received write operation command, the first column decoder to perform the write operation.

5. The memory of claim 1, wherein the memory comprises a dynamic random access memory.

6. A method for operating a memory, wherein the memory comprises a storage cell array, a write driver, a first column decoder and a first column selection line, the first column selection line comprises a dummy route and a loaded route and the first column decoder is coupled to the storage cell array via the dummy route and the loaded route,
   the method for operating the memory comprises:
   transmitting, by the write driver, a data signal to be written to a first storage cell area of the storage cell array according to a received write operation command;
   transmitting, by the first column decoder, a first column selection signal to the loaded route via the dummy route; and
   transmitting, via the loaded route, the first column selection signal to the first storage cell area, the first column selection signal being configured to select a storage cell column, on which a write operation is performed, from the first storage cell area,
   wherein a transmission direction of the data signal to be written transmitted by the write driver is identical to a transmission direction of the first column selection signal transmitted via the loaded route;
   wherein the memory cell array comprises a second storage cell area and the first storage cell area arranged in parallel along the first direction, the first direction is a direction along which the write driver, the storage cell array and the first column decoder are successively arranged, and the method comprises:
   transmitting, by the first column decoder via the dummy route, the first column selection signal to the loaded route in a second direction opposite to the first direction, wherein the dummy route is located in the first storage cell area; and
   transmitting, via the loaded route, the first column selection signal to the first storage cell area in the first direction, wherein the loaded route is coupled to the first storage cell area, and the first column selection signal is configured to select the storage cell column, on which the write operation is performed, from the first storage cell area.

7. The method for operating a memory of claim 6, wherein the memory further comprises a second column decoder, the second column decoder and the first column decoder are located on two opposite sides of the storage cell array, and the second column decoder and the write driver are located on a same side of the storage cell array, the method further comprises:
performing, by the second column decoder, a write operation on the second storage cell area.

8. The method for operating a memory of claim 7, wherein the memory further comprises a second column selection line,
performing, by the second column decoder, the write operation on the second storage cell area, comprising:
transmitting, via the second column selection line, a second column selection signal to the second storage cell area, wherein the second column selection signal is configured to select a storage cell column, on which the write operation is performed, from the second storage cell area.

9. The method for operating a memory of claim 6, wherein the memory further comprises a command decoder, the method further comprises:
controlling, by the command decoder according to a received write operation command, the first column decoder to perform the write operation.

* * * * *